United States Patent
Bajaj et al.

(10) Patent No.: US 6,261,157 B1
(45) Date of Patent: Jul. 17, 2001

(54) SELECTIVE DAMASCENE CHEMICAL MECHANICAL POLISHING

(75) Inventors: Rajeev Bajaj; Fritz C. Redeker, both of Fremont; John M. White, Hayward; Shijian Li, San Jose; Yutao Ma, Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/318,225

(22) Filed: May 25, 1999

(51) Int. Cl.[7] ............................................ B24B 7/22
(52) U.S. Cl. ............................ 451/57; 45/41; 45/288; 45/287
(58) Field of Search ........................... 457/57, 41, 66, 457/6, 285–289; 438/692, 693

(56) References Cited

U.S. PATENT DOCUMENTS

| | | | |
|---|---|---|---|
| 5,498,199 | * | 3/1996 | Karlsrud et al. ................ 451/66 |
| 5,816,891 | * | 10/1998 | Woo ................................ 451/57 |
| 5,897,426 | * | 4/1999 | Somekh .......................... 451/41 |
| 5,913,712 | * | 6/1999 | Molinar .......................... 451/57 |
| 6,062,954 | * | 5/2000 | Izumi ............................. 451/57 |

* cited by examiner

Primary Examiner—Jospeh J. Hail, III
Assistant Examiner—George Nguyen
(74) Attorney, Agent, or Firm—Fish & Richardson

(57) ABSTRACT

A selective Damascene chemical mechanical polishing (CMP) technique is used to planarize a semiconductor device to remove surface topography. The semiconductor device includes a semiconductor layer formed on a substrate, an insulating layer formed over the semiconductor layer and patterned to expose a portion of the semiconductor layer, a barrier layer formed over the insulating layer and the exposed portion of the semiconductor layer, and an electrically conductive layer formed over the barrier layer. The semiconductor device is pressed against a first rotating polishing pad that has no embedded abrasive particles to remove a portion of the conductive layer that overlies both the barrier layer and the insulating layer. The semiconductor device is then pressed against a second rotating polishing pad that has embedded abrasive particles to expose a portion of the barrier layer that overlies the insulating layer. The device is then pressed against a third rotating polishing pad that has no embedded abrasive particles to remove the portion of the barrier layer that overlies the insulating layer.

18 Claims, 5 Drawing Sheets

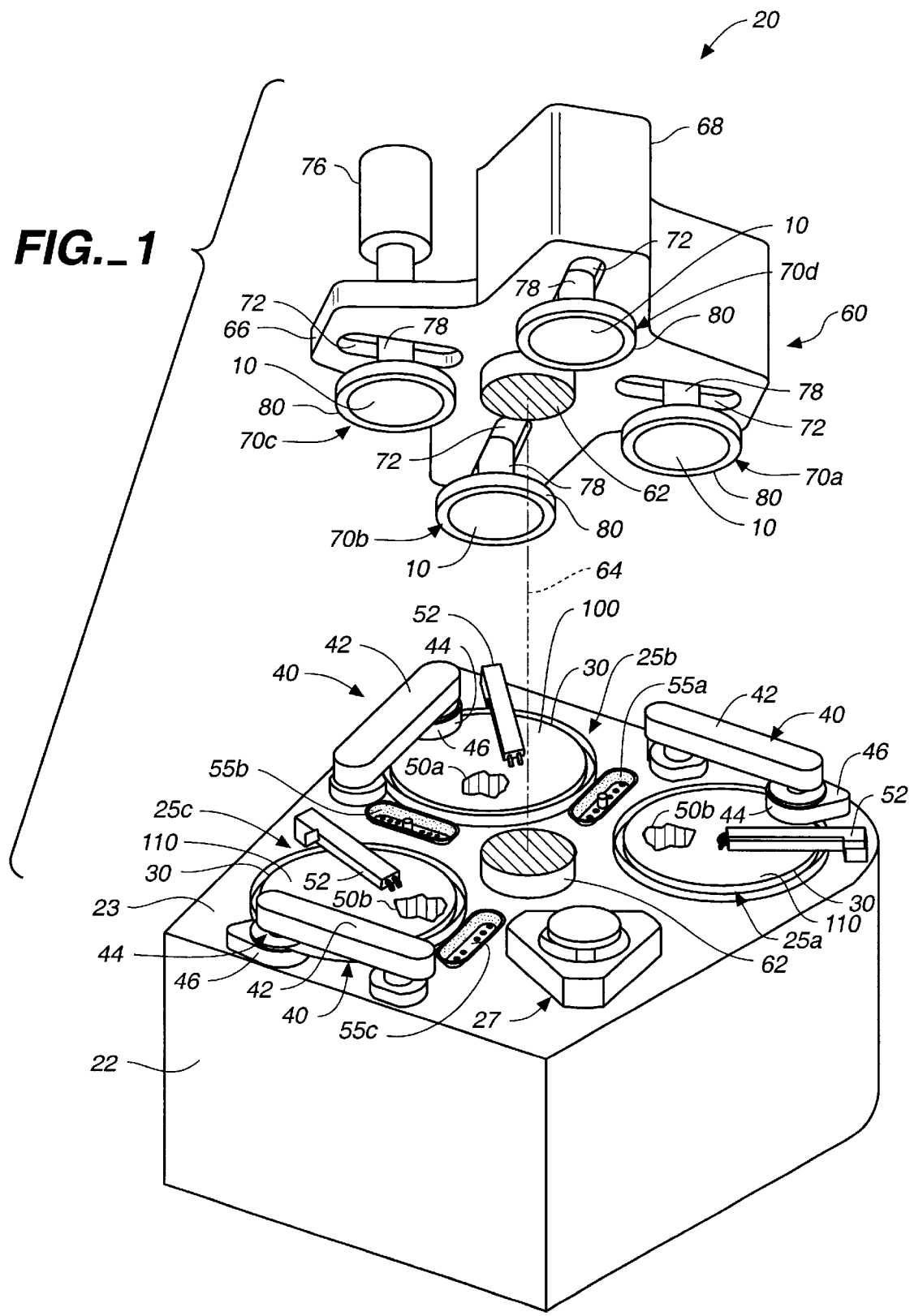
FIG._1

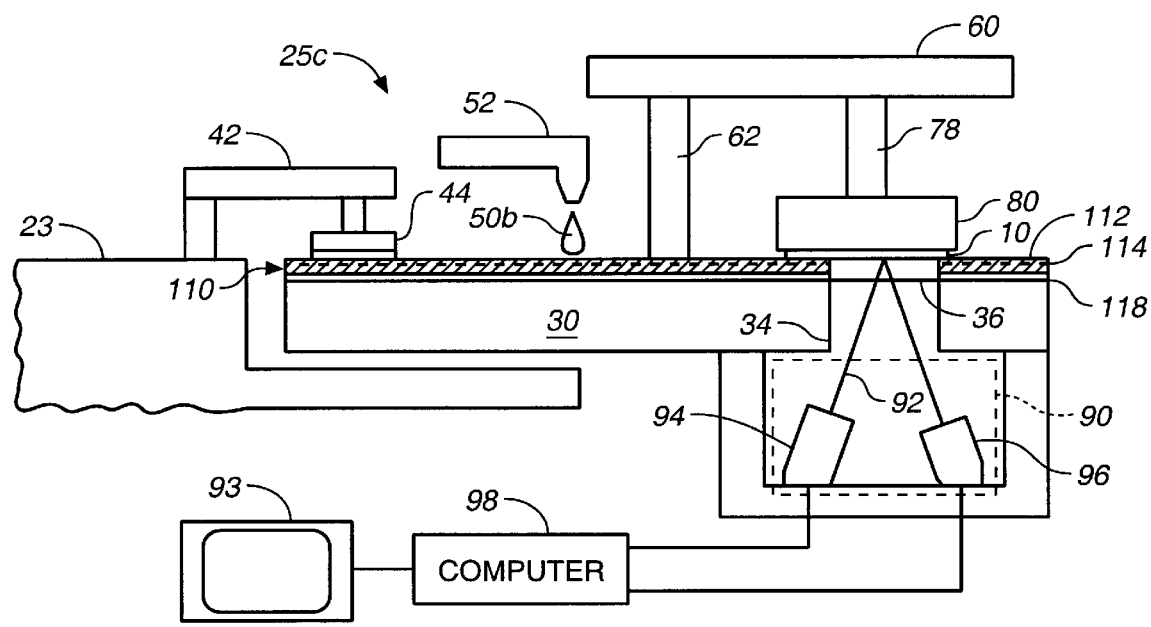
FIG._2A
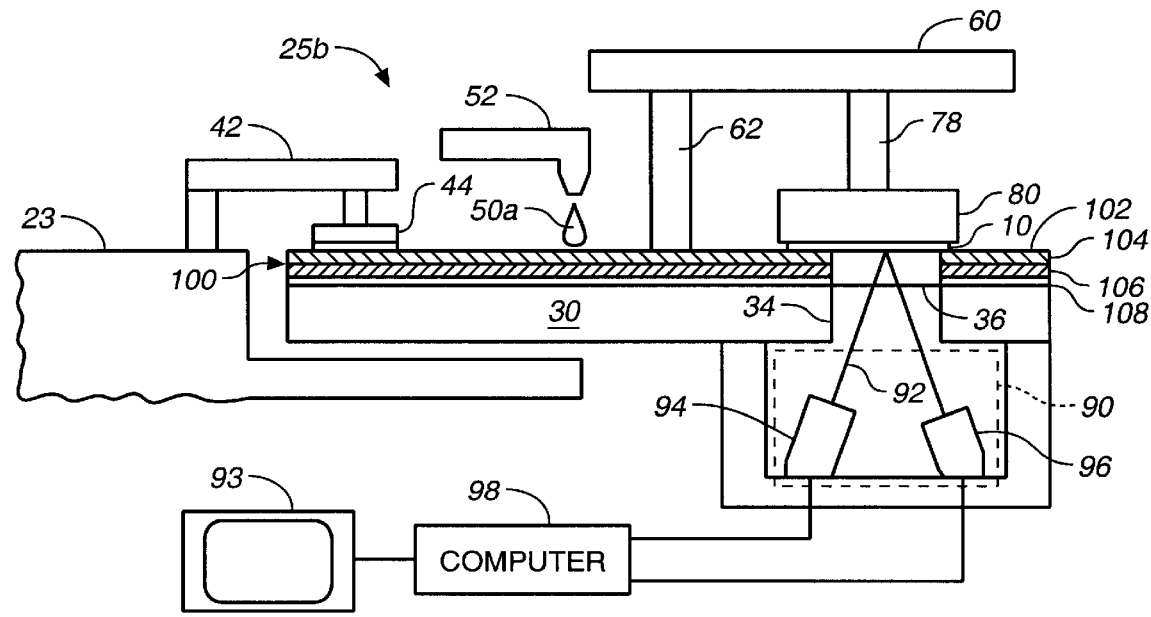
FIG._2B

FIG._3A
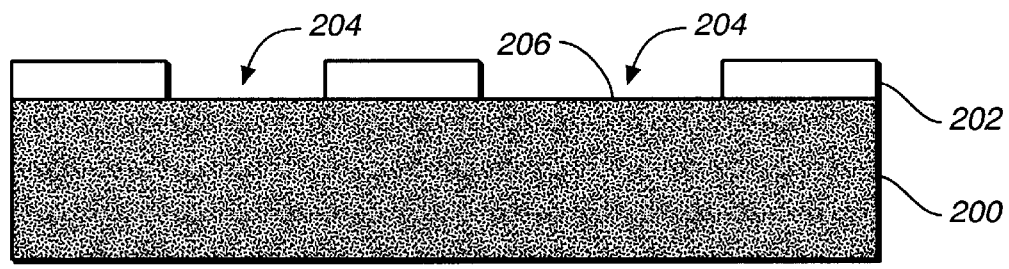
FIG._3B
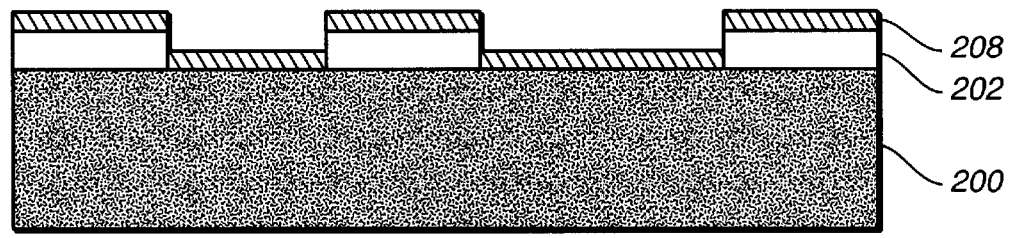
FIG._3C
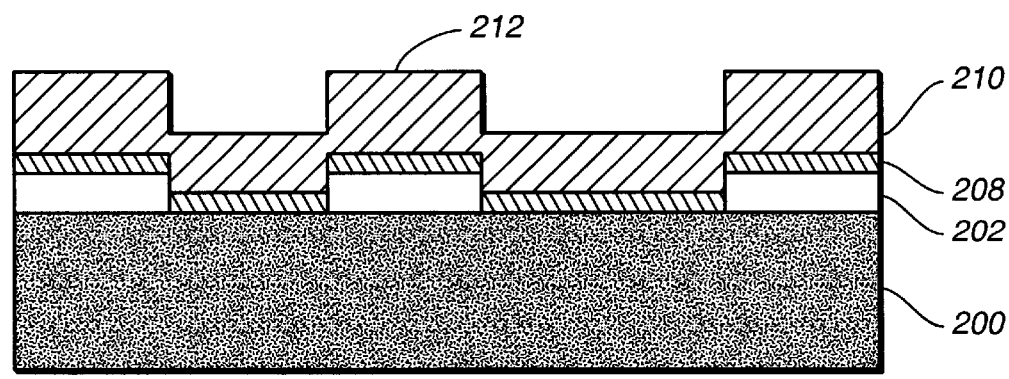
FIG._3D

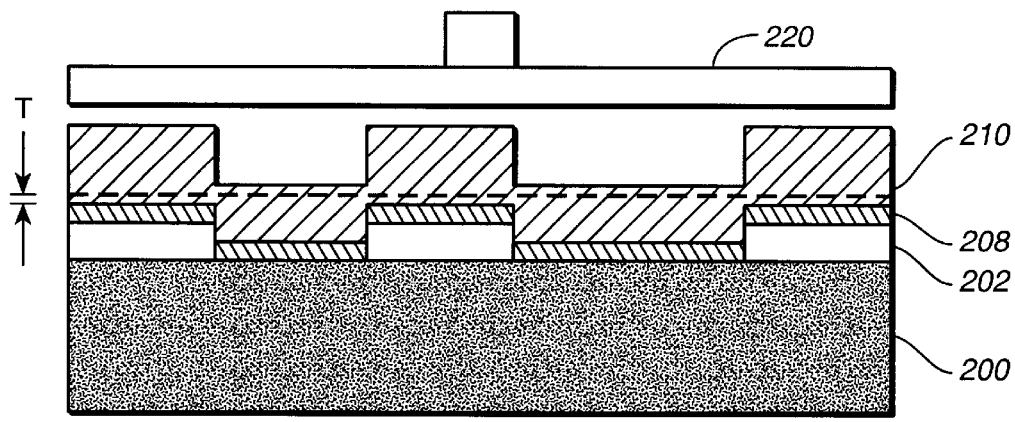
FIG._4A
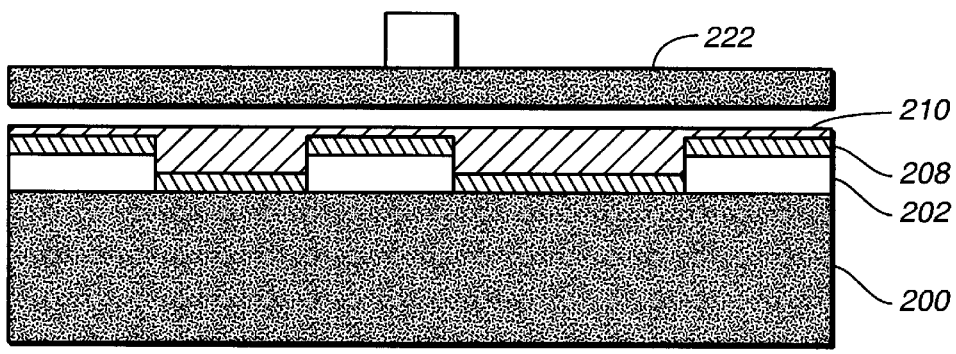
FIG._4B
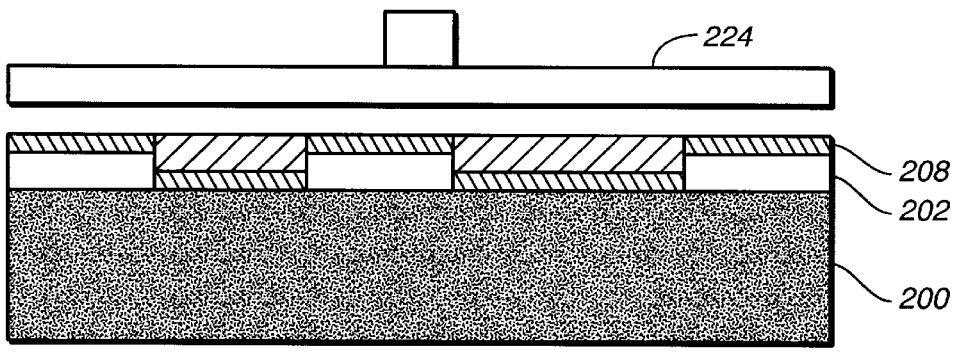
FIG._4C
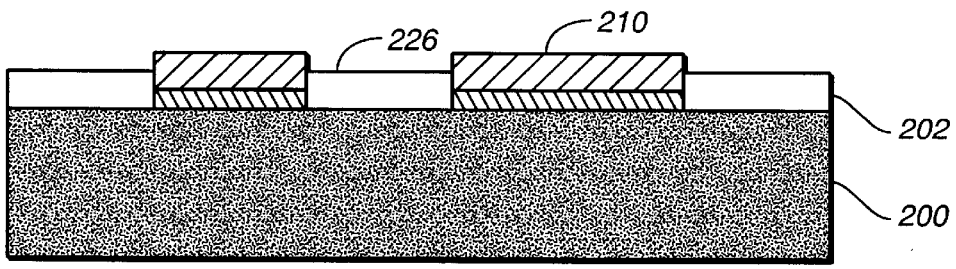
FIG._4D

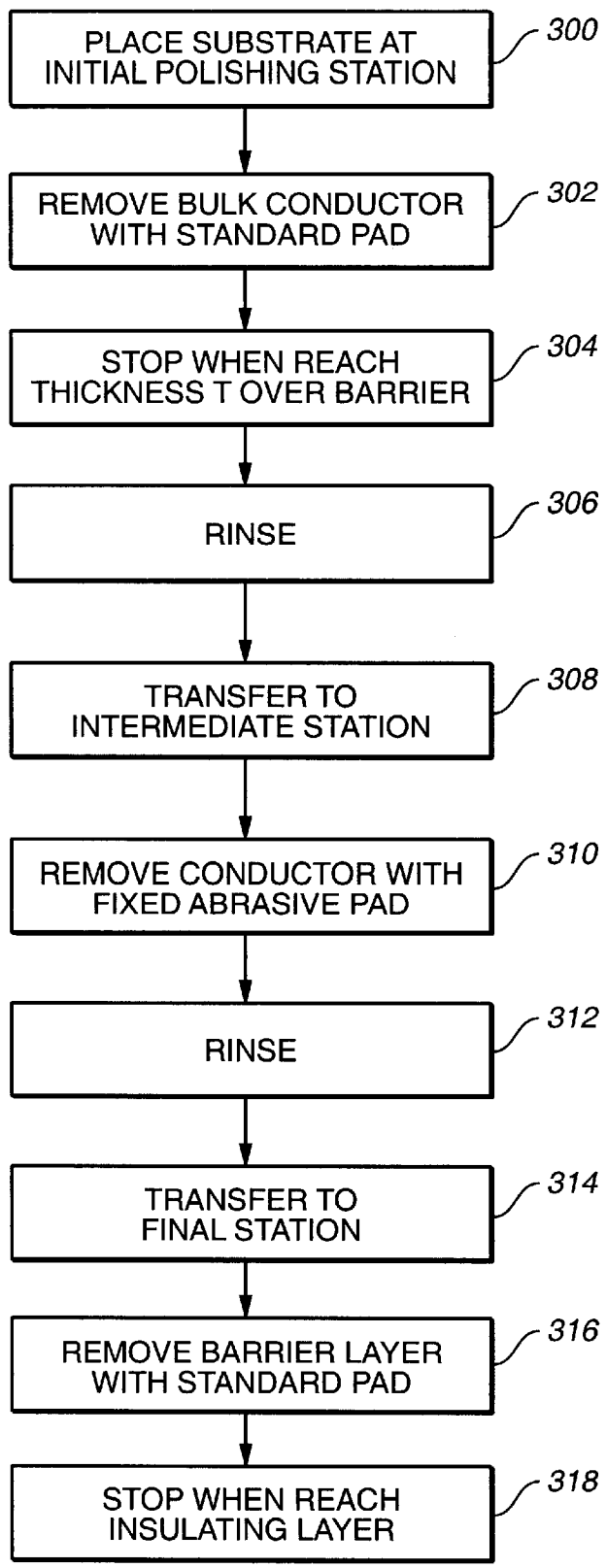
FIG._5

SELECTIVE DAMASCENE CHEMICAL MECHANICAL POLISHING

TECHNICAL FIELD

This application relates to semiconductor fabrication and, more particularly, to chemical mechanical polishing of a semiconductor wafer.

BACKGROUND

Integrated circuits (ICs) typically are formed by depositing some combination of conductive, semiconductive, insulating, and barrier-forming materials on a semiconductor substrate, such as a doped silicon wafer. One common technique for producing an IC, known as "subtractive metallization," involves depositing a conductive or semiconductive layer on the substrate and then etching away a portion of the conductive layer to form a conductive pattern. A barrier layer usually separates the conductive layer from the semiconductor substrate to protect the substrate from contamination by the conductive material. In most cases, additional conductive or semiconductive layers are deposited over the original conductive layer. Each pair of adjacent conductive layers is separated by an insulating layer which, like the original conductive layer, is patterned to allow ohmic contact between the conductive layers.

Another common technique for producing an IC, known as "Damascene metallization," involves forming an insulating layer directly over the semiconductor substrate, etching the insulating layer to form an opening over a portion of the semiconductor substrate, depositing a barrier layer over the insulating layer and the opening, and then depositing a conductive material over the barrier layer. The opening in the insulating layer allows ohmic contact between the conductive layer and a portion of the semiconductor substrate. The barrier layer protects the semiconductor substrate from contamination by the conductive layer.

One problem with these semiconductor fabrication techniques is that etching the conductive layers produces unwanted topography on the surface of the semiconductor device for subsequent processing. Damascene processing has the potential of creating topography-free surfaces. The complexity of the topography increases with the number of additional layers. As a result, most semiconductor manufacturing processes include one or more planarization steps to remove topography from the surfaces of semiconductor devices.

Chemical mechanical polishing (CMP) is one very common type of planarization process. In general, a CMP process involves mounting the semiconductor device on a carrier or polishing head and pressing the surface of the device against a rotating polishing pad. A traditional slurry-based CMP process uses a standard polishing pad in combination with a liquid slurry that includes a chemically reactive agent and abrasive particles. Recently developed "slurryless" CMP processes use fixed-abrasive pads in conjunction with polishing liquids containing chemically reactive agents but no abrasive particles. A fixed-abrasive pad includes abrasive particles embedded within a containment media. A standard polishing pad has a durable surface with no embedded abrasive particles.

An effective CMP process not only provides a high polishing rate, but also provides a substrate surface that lacks small-scale roughness (i.e., is "finished") and that lacks large-scale topography (i.e., is "flat"). The polishing rate, finish, and flatness associated with a particular CMP process are determined by several factors, including the type of pad and the type of slurry used, the relative speed between the semiconductor substrate and the polishing pad, and the amount of pressure that forces the semiconductor substrate against the polishing pad.

Planarization of a semiconductor device formed by Damascene metallization usually involves a conventional Damascene CMP process. Damascene CMP techniques use standard polishing pads and "selective" or "nonselective" slurries. Nonselective slurries attempt to polish the conductive layer and the barrier layer simultaneously, leaving a perfectly planarized surface on which only the insulating layer and the conductive material in the trenches of the insulating layer are exposed. However, current semiconductor fabrication techniques usually produce devices with nonuniformities in the conductive layer, which leads to uneven removal time across the surface of the device. This combined with CMP within-wafer-nonuniformity (WIWNU) can lead to significant variation across the wafer in dishing and erosion. As a result, the insulating layer becomes exposed at some areas on the device while thin layers of barrier and conductive materials remain on other areas of the device. Moreover, because conventional nonselective polishing techniques remove insulating, barrier, and conductive materials at similar rates, these nonuniformities in the surface of the semiconductor device leads to a phenomenon known as "metal thinning." Selective slurries cause dishing and erosion across the wafer.

SUMMARY

The inventors have developed a Damascene CMP technique that virtually eliminates dishing and large-scale topography from the polished surface, while achieving fast throughput. This technique trivializes nonuniformities in the conductive layer by ensuring that polishing does not begin on the barrier layer until all or almost all of the overlying conductive material is removed.

In some aspects, the invention involves planarizing a semiconductor device to remove surface topography. The semiconductor device includes a semiconductor layer formed on a substrate, an insulating layer formed over the semiconductor layer and patterned to expose a portion of the semiconductor layer, a barrier layer formed over the insulating layer and the exposed portion of the semiconductor layer, and an electrically conductive layer formed over the barrier layer. The semiconductor device is pressed against a first rotating polishing pad that has no embedded abrasive particles to remove a portion of the conductive layer that overlies both the barrier layer and the insulating layer. The semiconductor device is then pressed against a second rotating polishing pad that has embedded abrasive particles to expose a portion of the barrier layer that overlies the insulating layer. The device is then pressed against a third rotating polishing pad that has no embedded abrasive particles to remove the portion of the barrier layer that overlies the insulating layer.

In some embodiments, an electronic measurement device, such as a laser interferometer coupled to a digital computer, is used to monitor how much of the conductive layer remains over the barrier layer and the conductive layer. The semiconductor device is usually removed from the first polishing pad when a predetermined amount of the conductive layer remains over the barrier layer and the insulating layer. For example, for a semiconductor device in which the barrier layer has a thickness on the order of a few hundred angstroms (e.g., 200–300 Å) and the conductive layer has a thickness on the order of a few microns (e.g., 1.2 $\mu$m), some embodiments involve removing the semiconductor device from the first polishing pad when the conductive layer has a thickness on the order of a few hundred to a few thousand angstroms (e.g., 2000 Å). In certain embodiments, the barrier layer includes a material such as tantalum, the conductive layer includes a material such as copper, and the insulating layer includes an oxide material, such as silicon dioxide.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1 is a schematic exploded perspective view of a chemical mechanical polishing machine.

FIG. 2A is a cross-sectional view and functional block diagram of a polishing station at which a conventional polishing pad is used in a slurry-based CMP process.

FIG. 2B is a schematic cross-sectional view and a functional block diagram of a polishing station at which a fixed abrasive pad is used in a slurryless CMP process.

FIGS. 3A through 3D are cross-sectional views of a Damascene semiconductor fabrication process.

FIGS. 4A through 4D are cross-sectional views of a semiconductor substrate at various stages of a selective Damascene CMP process.

FIG. 5 is a flowchart of a selective Damascene CMP process.

Like reference numbers and designations in the various drawings indicate like elements.

DETAILED DESCRIPTION

FIG. 1 shows a typical multi-platen chemical mechanical polishing (CMP) machine 20. The CMP machine 20 includes a lower machine base 22 on which a tabletop 23 is mounted. The tabletop 23 supports a series of polishing stations, including an initial polishing station 25a, an intermediate polishing station 25b, and a final polishing station 25c. The tabletop 23 also includes a transfer station 27 that, in most systems, performs several functions. These functions include receiving individual substrates 10 from a loading apparatus, washing the substrates, loading the substrates into carrier heads, receiving the substrates from the carrier heads, washing the substrates again, and transferring the substrates back to the loading apparatus. In the depicted example, the transfer station 27 and the three polishing stations 25a, 25b, 25c are arranged in a generally square-shaped configuration.

Each of the polishing stations 25a, 25b, 25c includes a rotating platen 30 that holds a polishing pad. As described in more detail below, the initial and final stations 25a, 25c hold standard polishing pads 100, and the intermediate station 25b holds a fixed-abrasive pad 110. For substrates that are standard "eight-inch" (200 millimeter) and "twelve-inch" (300 millimeter) disks, the platens 30 and polishing pads 25a, 25b, 25c are approximately twenty and thirty inches in diameter, respectively. Each platen 30 connects to a platen drive motor (not shown) which, in most systems, rotates the platen 30 at a rate of between 30 and 200 revolutions per minute. The speed at which the platen rotates varies from application to application, and in some cases the rate of rotation is less than 30 rpm and greater than 200 rpm.

In some systems, at least one of the polishing stations includes a pad conditioning device 40 that reconditions the polishing surface of the polishing pad. The pad conditioning device 40 includes an arm 42 with an independently rotating conditioning head 44 and an associated washing basin 46. The pad conditioning device 40 is used to recondition the polishing surfaces of polishing pads, which increases the life expectancy of the pads. In general, fixed abrasive pads are not designed for reconditioning, so in this embodiment pad conditioning devices are needed only at the initial and final polishing stations 25a, 25c. Nevertheless, the CMP machine 20 often includes a pad conditioning device at each of the polishing stations to ensure that the CMP machine 20 is equipped for use in CMP processes other than the Damascene process described here.

Each of the polishing stations 25a, 25b, 25c also includes a fluid delivery arm 52 that serves to delivery both slurry (or a polishing liquid) and a rinsing liquid to the platens 30. During the Damascene CMP process described here, the arm 52 at the intermediate station 25b delivers a polishing liquid 50a that includes deionized water and a chemically reactive agent. Because the intermediate station 25b holds a fixed abrasive pad, the polishing liquid 50a at this station does not contain abrasive particles. The fluid delivery arms 52 at the initial and final stations 25a, 25c deliver slurries 50b that contain deionized water, chemically reactive agents, and, in most cases, abrasive particles. The concentrations of agents in the slurries and the polishing liquid often vary from platen to platen and from system to system.

Each of the fluid delivery arms 52 usually includes two or more liquid supply tubes that provide the slurry or polishing liquid to the surface of the polishing pad. The arms usually provide enough fluid to wet the entire surface of the polishing pad. Each fluid delivery arm 52 also includes one or more spray nozzles (not shown) that rinse the polishing pad at the end of each polishing and conditioning cycle.

Many systems also include intermediate washing stations 55a, 55b, 55c positioned adjacent to the polishing stations 25a, 25b, 25c. The washing 55a, 55b stations rinse the substrates after they leave the polishing stations.

The CMP machine 20 has a rotating multi-head carousel 60 positioned above the lower machine base 22. A center post 62 supports the carousel 60, and a carousel motor inside the machine base 22 rotates the carousel 60 about a carousel axis 64. The center post 62 also supports a carousel support plate 66 and a cover 68.

The carousel 60 includes four carrier head systems 70a–d. Three of the carrier head systems receive and hold substrates and press the substrates against the polishing pads on the platens 30 at the polishing stations 25a, 25b, 25c. The other carrier head system receives substrates from and delivers substrates to the transfer station 27.

The four carrier head systems 70a–d are mounted on the carousel support plate 66 at approximately equal angular intervals about the carousel axis 64. The carousel motor rotates the carousel support plate 66 about the carousel axis 64, thus causing the carrier head systems 70a–d and the substrates to move among the polishing stations and the transfer station.

Each carrier head system 70a–d includes a substrate carrier or carrier head 80. A carrier drive shaft 74 in each carrier head system connects a carrier head rotation motor 76 to the carrier head 80. As a result, each carrier head 80 rotates independently about its own axis. Each carrier head 80 also oscillates, laterally and independently, in a radial slot 72 formed in the carousel support plate 66. A slider (not shown) supports each drive shaft in its associated radial slot. A radial drive motor (not shown) moves the slider to oscillate the carrier head laterally.

Each carrier head 80 performs several mechanical functions. For example, the carrier head usually holds the substrate against the polishing pad, evenly distributes a downward pressure across the back surface of the substrate, transfers torque from the drive shaft to the substrate, and ensures that the substrate does not slip away from the polishing pads during the polishing process.

FIGS. 2A and 2B are partial cross-sectional views and functional block diagrams of the CMP machine. In many systems, an aperture or hole 34 is formed in each platen 30, and a transparent window 36 is formed in a portion of the polishing pad that overlies the hole. The hole 34 and the transparent window 36 are positioned such that a laser beam 92 emitted by a laser interferometer 90 positioned below the platen 30 briefly contacts the substrate 10 each time the platen rotates. The laser interferometer 90 includes a laser 94 and a detector 96 that together are used to identify the amount of material removed from the surface of the substrate or to determine when the surface is planarized. A digital computer 98, such as a general purposed programmable computer or a special purposed programmed computer, activates the laser when the substrate overlies the window, stores measurements from the detector, displays the measurements on an output device 93, and detects when the polishing process is complete. Using a laser interferometer to identify the amount of material removed is described in U.S. patent application Ser. No. 08/689,930, filed on Aug. 26, 1996, U.S. Pat. No. 5,893,796 and entitled "Method of Forming a Transparent Window in a Polishing Pad for a Chemical Mechanical Polishing Apparatus."

FIG. 2A illustrates a polishing station, such as the initial and final polishing stations 25a, 25c, that uses a standard polishing pad 110 to carry out a conventional slurry-based polishing process. The standard polishing pad 110 has a generally smooth polishing surface 112 and, in most cases, includes a single soft polishing layer 114. One type of pad includes a polishing layer that is formed from a napped poromeric synthetic material. The polishing pad 110 also includes a pressure sensitive adhesive layer 118 that attaches the pad 110 to the platen 30. In some cases, the polishing pad 110 is embossed or stamped with a pattern on its polishing surface to improve slurry distribution over the semiconductor substrate.

An alternative design for the polishing pad 110 uses two layers, including a polishing layer that has a durable, roughened surface and a backing layer, which is softer than the polishing layer. One type of two-layer pad includes a polishing layer that is formed from a polyurethane or microporous polyurethane material mixed with a filler material and a backing layer formed from compressed felt fibers leached with urethane. Both the polishing and backing layers are approximately fifty mils thick in a typical pad.

FIG. 2B shows a polishing station, such as the intermediate polishing station 25b, that uses a fixed-abrasive polishing pad 100 having an abrasive polishing surface 102. The fixed-abrasive pad 100 usually includes a polishing layer 104 and a backing layer 106. An adhesive layer 108 attaches the fixed abrasive pad to the platen 30. The polishing layer 104 is an abrasive composite layer that usually is formed from abrasive grains held or embedded in a binder material. This layer is between about 5 mil and 200 mil thick in a typical fixed abrasive pad. The abrasive grains usually have a particle size between about 0.1 and 1500 microns and a Mohs' hardness of at least 8. Examples of such grains include fused aluminum oxide, ceramic aluminum oxide, green silicon carbide, silicon carbide, chromia, alumina zirconia, diamond, iron oxide, ceria, cubic boron nitride, garnet, and combinations of these materials. The binder material often is formed from a precursor that includes an organic polymerizable resin, which is cured from the binder material. Examples of such resins include phenolic resins, urea-formaldehyde resins, melamine formaldehyde resins, acrylated urethanes, acrylated epoxies, ethylenically unsaturated compounds, aminoplast derivatives having at least one pendant acrylate group, isocyanurate derivatives having at least one pendant acrylate group, vinyl ethers, epoxy resins, and combinations of these materials. The backing layer 106 is usually formed from a material such as a polymeric film, paper, cloth, metallic film, or the like and usually has a thickness between 25 mil and 200 mil. Fixed-abrasive polishing pads are described in detail in the following U.S. Pat. No. 5,152,917, issued on Oct. 6, 1992, and entitled STRUCTURED ABRASIVE ARTICLE; U.S. Pat. No. 5,342,419, issued on Aug. 30, 1994, and entitled ABRASIVE COMPOSITES HAVING A CONTROLLED RATE OF EROSION, ARTICLES INCORPORATING SAME, AND METHODS OF MAKING AND USING SAME; U.S. Pat. No. 5,368,619, issued on Nov. 29, 1994, and entitled REDUCED VISCOSITY SLURRIES, ABRASIVE ARTICLES MADE THEREFROM AND METHODS OF MAKING SAID ARTICLES; and U.S. Pat. No. 5,378,251, issued on Jan. 3, 1995, and entitled ABRASIVE ARTICLES AND METHOD OF MAKING AND USING SAME. Fixed-abrasive pads are available from 3M Corporation of Minneapolis, Minn.

FIGS. 3A–3D illustrate the fabrication of a semiconductor device using a Damascene metallization process. The process begins with a substrate 200 that usually includes a silicon wafer having a semiconductor layer formed by doping the wafer. An insulating layer 202 is formed over the substrate 200 by depositing an electrically insulating material, such as an oxide-based material like silicon oxide or indium oxide (FIG. 3A). Trenches or cavities 204 are formed in the insulating layer 202 by etching away portions of the insulating material (FIG. 3B). The cavities 204 expose portions of the substrate surface 206.

A protective barrier layer 208 then is formed over the insulating layer 202 and the exposed portions of the substrate surface 206 (FIG. 3C). The barrier layer 208 is formed from an electrically conductive material, such as tantalum, that tends not to diffuse, or migrate, into the semiconductor substrate 200. An electrically conductive layer 210 is formed over the barrier layer 208 (FIG. 3D). The electrically conductive layer 210 usually is formed from a highly conductive material, such as copper, that tends to diffuse into semiconductor materials. The barrier layer 208 prevents this diffusion from occurring. Most semiconductor devices include additional insulating and conductive layers, each patterned as necessary to form appropriate ohmic connections between layers.

The conductive layer 210 is usually very thick with respect to the barrier layer. For example, in a typical semiconductor device, the conductive layer 210 is formed by depositing copper to a thickness on the order of 1.2 $\mu$m, while the barrier layer 208 is formed by depositing tantalum to a thickness on the order of 200–300 Å. The insulating layer 202 also is thick with respect to the barrier layer, typically on the order of 8000 Å. Likewise, the thickness of the conductive layer 210 in the cavities 204 after polishing is on the order of 8000 Å.

FIG. 3D shows the large-scale topography that exists on the top surface 212 of the semiconductor device after the conductive layer 210 is deposited. A selective Damascene polishing process, described below, is used to planarize the device, removing essentially all of the material in the conductive and barrier layers 210, 208, except for the material that lies within the cavities 204 in the insulating layer 202. This selective polishing technique is designed to avoid the dishing that occurs when conventional nonselective Damascene polishing techniques are used. In general, dishing occurs, at least in part, because the materials typically used to form the conductive layer 210, such as copper, polish much more quickly than the materials typically used to form the barrier layer 208, such as tantalum. As a result, the polishing pad in a conventional nonselective Damascene polishing process bows into the cavities 204 when it reaches the barrier layer 202, forming "dishes" in the surface of the conductive material filling the cavities 204.

FIGS. 4A–4D and 5 illustrate the selective Damascene polishing process. The CMP machine begins the process by placing the semiconductor device at the initial polishing station (step 300). At this station, a standard polishing pad 220 (110 in FIG. 2A) is used to polish away most of the conductive layer 210 in a conventional slurry-based process (step 302). Polishing at the initial station stops when the conductive layer 210 is reduced to a predetermined thickness T over the barrier layer 208 (step 304). The exact thickness T at which polishing stops varies from application to application, but a thickness on the order of 2000 Å is typical for a copper layer formed over a tantalum barrier. One technique for measuring the thickness of the conductive material over the barrier layer is by storing the initial thickness in a digital computer and using a laser interferometer to measure how much of the conductive material has been removed. The CMP machine then rinses the surface of the semiconductor device (step 306) and transfers the device to the intermediate polishing station (step 308).

At the intermediate polishing station, a fixed abrasive pad 222 (100 in FIG. 2B) is used to polish away the rest of the conductive layer 210 above the barrier layer 208 in a conventional slurryless process (step 310). Fixed abrasive pads, like those produced by 3M Corporation, are particularly useful in polishing copper away from a tantalum barrier because fixed abrasive pads have virtually no effect on the tantalum layer. Fix abrasive pads also polish without abrasive slurries and therefore exhibit good large scale polishing properties. As a result, polishing with the fixed abrasive pad 222 at the intermediate polishing station trivializes nonuniformities in the conductive layer 210 by removing all conductive material from the barrier layer 208 without removing any of the barrier material. The fixed abrasive pad 222 also does not cause dishing of the conductive material in the cavities 204. This ensures that the surface of the semiconductor device is flat and finished after polishing at the intermediate station. The CMP machine then rinses the surface of the semiconductor device (step 312) and transfers the device to the final polishing station (step 314).

At the final polishing station, the CMP machine uses another standard polishing pad 224 to polish away the barrier layer 208 in a conventional slurry-based process (step 316). The final polishing station uses a selective polishing process that removes all or almost all of the barrier material over the insulating layer 202 but that removes very little, if any, of the conductive material in the cavities 204. Polishing at the final station stops when the polishing pad 224 reaches the insulating layer (step 318). Because a selective polishing process is used at this station, the conductive material in the cavities 204 protrudes slightly above the surface 226 of the insulating layer 202, but the amount by which the conductive material protrudes is very small (200–300 Å) with respect to the thickness of the insulating layer (8000 Å). Variations in the surface topology of the semiconductor device are insignificant when less than 5% of the cavity thickness.

A number of embodiments of the present invention are described above. Nevertheless, a person of ordinary skill in this technology area will understand that various modifications are possible without departing from the spirit and scope of the invention. For example, the selective Damascene polishing technique is useful with semiconductor devices made from materials other than copper, tantalum, and oxide. Suitable materials include, but are not limited to, conductive materials such as aluminum, tungsten, and BST; barrier materials such as titanium, titanium nitride, tungsten, tungsten nitride, and tungsten silicon nitride; and insulating materials such as BPSG, FSG, Teos, $SiO_2$, low K, and porous low K materials. Moreover, while the invention is described here in terms of insulating, barrier, and conductive layers formed directly on a substrate, other embodiments include any number of insulating barrier, conductive, and semiconductive layers between the substrate and the surface to be planarized. Other embodiments also include planarizing the semiconductor device more than once at various stages of the fabrication process. Accordingly, other embodiments are within the scope of the following claims.

What is claimed is:

1. A chemical mechanical polishing system comprising:
    (a) a first polishing pad manufactured without embedded abrasive particles;
    (b) a second polishing pad manufactured with embedded abrasive particles;
    (c) a third polishing pad manufactured without embedded abrasive particles;
    (d) at least one carrier configured to hold a semiconductor device having a semiconductor layer formed on a substrate, an insulating layer formed over the semiconductor layer and patterned to expose a portion of the semiconductor layer, a barrier layer formed over the insulating layer, and an electrically conductive layer formed over the barrier layer; and
    (e) a controller configured to cause the at least one carrier to
        (1) press the semiconductor device against the third polishing pad while the third polishing pad and the semiconductor device undergo relative motion to remove a portion of the conductive layer that overlies both the barrier layer and the insulator layer;
        (2) press the semiconductor device against the second polishing pad while the second polishing pad and the semiconductor device undergo relative motion to expose a portion of the barrier layer that overlays the insulator layer; and
        (3) press the semiconductor device against the first polishing pad while the first polishing pad and the semiconductor device undergo relative motion to remove a portion of the conductive layer that overlies both the barrier layer and the insulator layer.

2. The system of claim 1, further comprising an electronic measurement device configured to monitor how much of the conductive layer remains over the barrier layer and the conductive layer.

3. The system of claim 1, wherein the carrier is configured to remove the semiconductor device from the first polishing pad when a predetermined amount of the conductive layer remains over the barrier layer and the insulating layer.

4. The system of claim 3, wherein the barrier layer has a thickness on the order of a few hundred angstroms and the conductive layer has a thickness on the order of a few microns, and wherein the carrier head is configured to remove the semiconductor device from the first polishing pad when the portion of the conductive layer that overlies both the barrier layer and the insulating layer has a thickness on the order of a few hundred to a few thousand angstroms.

5. The system of claim 3, wherein the barrier layer has a thickness of approximately 200–300 Å and the conductive layer has a thickness of approximately 1.2 μm, and wherein the carrier head is configured to remove the semiconductor device from the first polishing pad when the portion of the conductive layer that overlies both the barrier layer and the insulating layer has a thickness of approximately 2000 Å.

6. The system of claim 1, wherein the barrier layer comprises tantalum.

7. The system of claim 1, wherein the conductive layer comprises copper.

8. The system of claim 1, wherein the insulating layer comprises an oxide.

9. A method for use in planarizing a semiconductor device comprising:
(a) obtaining a semiconductor device having a semiconductor layer formed on a substrate, an insulating layer formed over the semiconductor layer and patterned to expose a portion of the semiconductor layer, a barrier layer, and an electrically conductive layer formed over the barrier layer;
(b) pressing the semiconductor device against a first polishing pad manufactured without embedded abrasive particles while the first polishing pad and the semiconductor device undergo relative motion to remove a portion of the conductive layer that overlies both the barrier layer and the insulator layer;
(c) pressing the semiconductor device against a second polishing pad manufactured with the embedded abrasive particles while the second polishing pad and the semiconductor device undergo relative motion to expose a portion of the barrier layer that overlays the insulator layer; and
(d) pressing the semiconductor device against a third polishing pad manufactured without embedded abrasive particles while the third polishing pad and the semiconductor device undergo relative motion to remove a portion of the conductive layer that overlies both the barrier layer and the insulator layer.

10. The method of claim 9, further comprising using an electronic measurement device to monitor how much of the conductive layer remains over the barrier layer and the conductive layer.

11. The method of claim 9, further comprising removing the semiconductor device from the first polishing pad when a predetermined amount of the conductive layer remains over the barrier layer and the insulating layer.

12. The method of claim 11, wherein the barrier layer has a thickness on the order of a few hundred angstroms and the conductive layer has a thickness on the order of a few microns, and wherein removing the semiconductor device from the first polishing pad occurs when the portion of the conductive layer that overlies both the barrier layer and the insulating layer has a thickness on the order of a few hundred to a few thousand angstroms.

13. The method of claim 11, wherein the barrier layer has a thickness of approximately 200–300 Å and the conductive layer has a thickness of approximately 1.2 μm, and wherein removing the semiconductor device from the first polishing pad occurs when the portion of the conductive layer that overlies both the barrier layer and the insulating layer has a thickness of approximately 2000 Å.

14. The method of claim 9, wherein the barrier layer comprises tantalum.

15. The method of claim 9, wherein the conductive layer comprises copper.

16. The method of claim 9, wherein the insulating layer comprises an oxide.

17. A chemical mechanical polishing system comprising:
(a) a first standard polishing pad;
(b) a fixed abrasive polishing pad;
(c) a second standard polishing pad;
(d) at least one carrier configured to receive a semiconductor device having a semiconductor layer formed on a substrate, an insulating layer formed over the semiconductor layer and patterned to expose a portion of the semiconductor layer, a barrier layer formed over the insulating layer, and an electrically conductive layer formed over the barrier layer; and
(e) a controller configured to cause the at least one carrier to
(1) press the semiconductor device against the first standard polishing pad while the first polishing pad and the semiconductor device undergo relative motion to remove a portion of the conductive layer that overlies both the barrier layer and the insulator layer;
(2) press the semiconductor device against the fixed-abrasive polishing pad while the fixed-abrasive polishing pad and the semiconductor device undergo relative motion to expose a portion of the barrier layer that overlays the insulator layer; and
(3) press the semiconductor device against the second standard polishing pad while the second polishing pad and the semiconductor device undergo relative motion to remove a portion of the conductive layer that overlies both the barrier layer and the insulator layer.

18. A method for planarizing a semiconductor device comprising:
(a) providing a semiconductor device having a semiconductor layer formed on a substrate, an insulating layer formed over the semiconductor layer and patterned to expose a portion of the semiconductor layer, a barrier layer formed over the insulating layer, and an electrically conductive layer formed over the barrier layer;
(b) chemical mechanical polishing the conductive layer with a first standard polishing pad manufactured without embedded abrasive particles until less than all of the conductive layer that overlies both the barrier layer and the insulator layer is removed;
(c) chemical mechanical polishing the conductive layer with a fixed-abrasive polishing pad manufactured with embedded abrasive particles until the barrier layer that overlays the insulator layer is exposed; and
(d) chemical mechanical polishing the barrier layer with a second standard polishing pad manufactured without embedded abrasive particles to remove a portion of the conductive layer that overlies both the barrier layer and the insulator layer.

* * * * *

UNITED STATES PATENT AND TRADEMARK OFFICE
CERTIFICATE OF CORRECTION

PATENT NO.   : 6,261,157 B1
DATED        : July 17, 2001
INVENTOR(S)  : John M. White, Shijian Li, Yutao Ma, Fritz C. Redeker and Rajeev Bajaj It is certified that error appears in the above-identified patent and that said Letters Patent is hereby corrected as shown below:

Column 9,
Line 26, after "layer" and before "," please insert -- formed over the insulating layer --.
Line 35, please delete -- the --.

Signed and Sealed this

Ninth Day of April, 2002

Attest:

JAMES E. ROGAN
Director of the United States Patent and Trademark Office

Attesting Officer